United States Patent

Möges et al.

[11] Patent Number: 6,082,798
[45] Date of Patent: Jul. 4, 2000

[54] DEVICE FOR GRIPPING MAGAZINES

[75] Inventors: Gerhard Möges, Feucht; Michael Kratzer, Röttenbach; Mark Ogden, Nürnberg, all of Germany

[73] Assignee: Siemens AG, Munich, Germany

[21] Appl. No.: 09/178,391

[22] Filed: Oct. 23, 1998

[30] Foreign Application Priority Data

Oct. 24, 1997 [DE] Germany ................ 297 18 994 U

[51] Int. Cl.$^7$ .................................................. B25J 15/00
[52] U.S. Cl. ..................... 294/119.1; 294/902; 414/940
[58] Field of Search .................... 294/119.1, 16, 294/34, 68.1, 68.3, 81.54, 81.62, 67.33, 902; 414/741, 935, 937, 938, 940; 901/36–39

[56] References Cited

U.S. PATENT DOCUMENTS

| | | | |
|---|---|---|---|
| 3,166,207 | 1/1965 | Quayle | 294/119.1 |
| 4,904,153 | 2/1990 | Iwasawa et al. | 294/119.1 |
| 5,120,101 | 6/1992 | Vranish | 294/119.1 |
| 5,788,458 | 8/1998 | Bonora et al. | 414/940 |

FOREIGN PATENT DOCUMENTS

| | | | |
|---|---|---|---|
| 0 412 945 | 2/1991 | European Pat. Off. . | |
| 527698 | 2/1993 | European Pat. Off. | 294/119.1 |
| 0 597 052 | 5/1994 | European Pat. Off. . | |
| 62-268137 | 11/1987 | Japan | 414/940 |
| 3102851 | 4/1991 | Japan | 414/940 |

*Primary Examiner*—Dean J. Kramer
*Attorney, Agent, or Firm*—Kenyon & Kenyon

[57] ABSTRACT

A robotic gripper, the grippers of which engage as positive-fit elements on a magazine wall. The gripper is used to grip magazines for lead frames. This prevents any pressure stress on the magazines. The positive-fit elements furthermore, because of their shape, prevent the lead frames from slipping out of the magazine under high accelerations.

2 Claims, 1 Drawing Sheet

DEVICE FOR GRIPPING MAGAZINES

BACKGROUND OF THE INVENTION

The invention relates to a device for gripping magazines for plate-shaped items, the magazines being configured as box profiles open at two lateral sides located opposite one another, and the other two sides having, in the interior of the profile, corresponding guides for the item to be inserted horizontally.

An example of such a device is set forth in European Patent No. 0 412 945 A1. The plate-shaped items provided therein are so-called "lead frames." The box-shaped-profile is implemented by way of two cheekpieces, equipped with internal guide slots, which can be joined to one another by strut elements. Gripping of the magazines is accomplished via a robot which positively engages in holes arranged on the upper side above the center of gravity of the magazines. This does guarantee secure gripping of the magazines, but in the event of vigorous acceleration movements not only is the mount heavily stressed, but a high torque is exerted on the robot hand.

European Patent No. 0 597 052 B1 discloses a further gripper of the kind noted above, in which clamping jaws grasp the two open rims of the box profile wall immediately adjacent to the gripper. While this provides that acceleration forces on the magazine are effectively transferred to the gripper mechanism, a powerful gripper application force is needed, which can subject the magazines to very high mechanical loads.

SUMMARY OF THE INVENTION

The present invention is directed to the problem of providing a device for gripping magazines such that the magazines can be held in a secure and low-torque fashion even in the presence of high accelerations, while no applied pressure is exerted on the magazines for such holding purposes.

The present invention solves this problem in that two positive-fit elements, each adapted to the rim of the box profile in the region of each of the openings, are provided as grippers.

According to a first advantageous embodiment of the invention, only the two open rims of the box profile wall immediately adjacent to the gripper can be grasped by the positive-fit elements. The two relatively narrow positive-fit elements are sufficient to securely grasp the respective magazine.

Because the rims have groove-like depressions for the engagement of pin-like configurations of the positive-fit elements, the positive-fit elements can be configured as U-shaped profiles open at their upper and lower ends, since the positive fit for the vertical direction is achieved by the groove/pin engagements.

According to a further embodiment of the invention, the guides can be overlapped by the positive-fit elements. This prevents the item mounted horizontally in the magazines from being unintentionally slung out of its position under strong acceleration forces.

Because means for synchronizing the gripping movement are provided, synchronized gripping ensures impact-free reception of the magazines after prepositioning of the entire gripping mechanism with respect to the particular magazine.

BRIEF DESCRIPTION OF THE DRAWING

An exemplary embodiment of the invention is depicted in the drawing and will be explained below in more detail.

DETAILED DESCRIPTION

Figure 1:
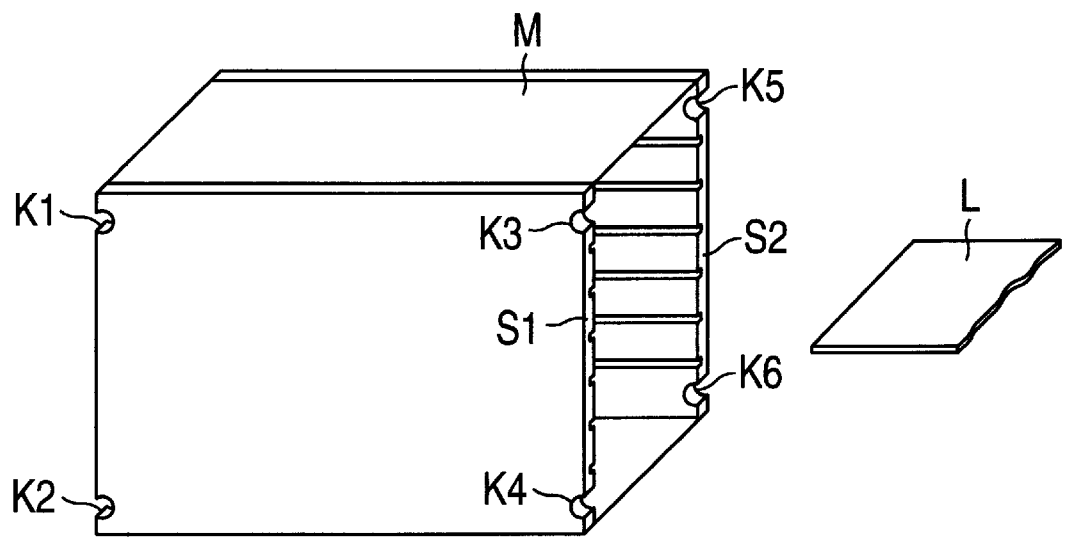
FIGS. 1 and 2 are perspective, exploded views of a magazine and gripper constructed according to the principles of the invention.
Figure 2:
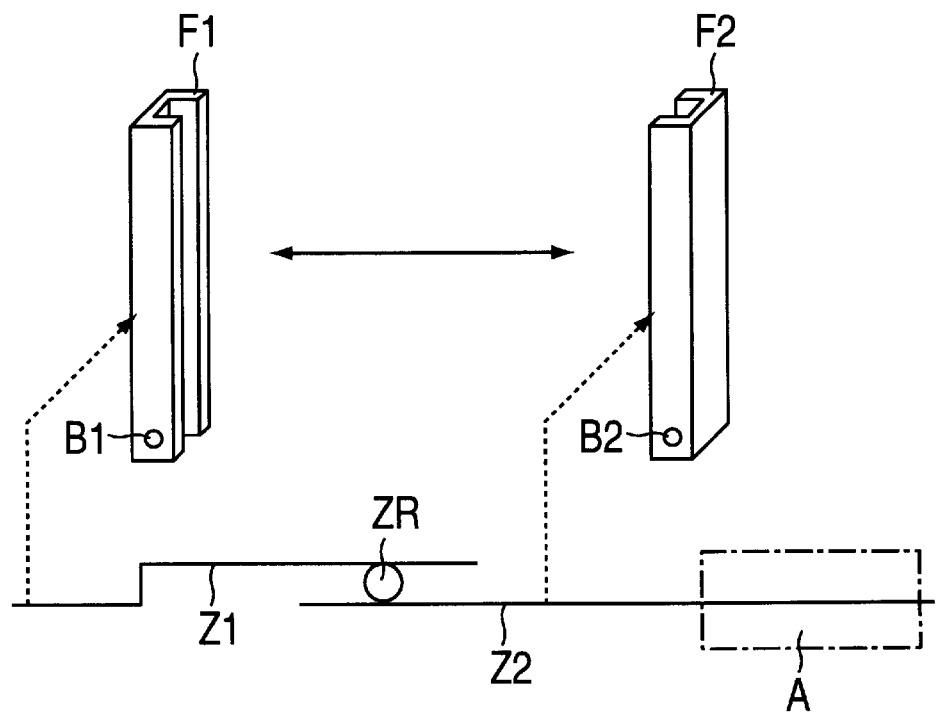

The Figures show, in perspective, a magazine M having an open box profile. This magazine may consist of side parts S1 and S2 which are joined to one another by any desired elements, whether plate-shaped elements or web-shaped elements. However joined, the side parts S1 and S2 have, on their sides facing one another, corresponding guides into which a plate-shaped item, for example a lead frame L, can be inserted.

When a loaded or unloaded magazine M is to be transported, a robot can be employed for this purpose. Such a robot (not otherwise shown in the interest of clarity) will typically have a tip on which a gripper is provided which can grip and transport the particular magazine M or one of the further magazines. Essential for this gripping operation, according to the invention, are two positive-fit elements F1 and F2 which, as indicated in the Figure by a double arrow, are movable with respect to one another. This movement can be triggered via a mechanism which consists of two toothed racks Z1 and Z2, of which toothed rack Z2 is moved by a positioning drive. A gear ZR between toothed racks Z1 and Z2 ensures that the two positive-fit elements F1 and F2 are movable in the same fashion in opposite directions to one another. By way of this gripping movement, positive-fit elements F1 and F2 can fit around side wall S1 of magazine M in the region of the magazine opening, and can be brought into a positive engagement, tilting of magazine M being prevented by the U-shape of positive-fit elements F1 and F2, and upward or downward slippage of magazine M within the U-shaped guides of positive-fit elements F1 and F2 being prevented by the fact that two pins B1 and B2 are arranged in them and engage into corresponding groove-like notches K1 and K2 of magazine M. Six further notches are provided on magazine M so that the magazine can be held even in an upside-down position or in a position in which side S1 faces toward a gripping mechanism. Of the symmetrically arranged notches necessary for the purpose, notches K1 and K2 as well as K5 and K6 are visible in the depiction besides the previously described notches K2 and K4.

Dashed arrows indicate that the synchronizing gripping mechanism engages on the positive-fit elements F1 and F2 at the level of their center, thus preventing unnecessary lever forces on positive-fit elements F1 and F2.

Drive A can be driven in any fashion—hydraulically, electrically, or pneumatically; however this is done, it is configured as a positioning drive, so that no forces are exerted by guide elements F1 and F2 on the particular magazine being held, for example magazine M. It is advisable for this purpose, and for the sake of reliability, to define a predefined tolerance clearance between magazine M and positive-fit elements F1 and F2.

What is claimed is:

1. A system for handling horizontally disposed plate-shaped items, comprising:
   a magazine for holding plate shaped items, the magazine comprising rectangular, vertically extending walls having inner sides along which longitudinally extend horizontally disposed facing grooves that form guides for receipt of the plate shaped items, and wherein the walls terminate at their sides in side edges such that the magazine is open at each end; and two grippers for grasping, in each case, the edges of the magazine such that the guides are overlapped to a degree sufficient to prevent items from inadvertently slipping out of the magazine, wherein the grippers have bolt-like positive-fit elements for cooperation with groove-like depressions on the edges of the magazine to facilitate the establishment of a grip without requiring an inwardly directed force.

2. The system as recited in claim 1, further comprising means for synchronizing the gripping motion of the grippers with each other.

* * * * *